United States Patent
Itoyama et al.

(10) Patent No.: US 6,803,515 B2
(45) Date of Patent: Oct. 12, 2004

(54) SOLAR-CELL-INSTALLED STRUCTURE, AND PHOTOVOLTAIC POWER GENERATION SYSTEM

(75) Inventors: Shigenori Itoyama, Nara (JP); Akiharu Takabayashi, Nara (JP); Hidehisa Makita, Kyoto (JP); Masaaki Matsushita, Nara (JP); Takaaki Mukai, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/157,970

(22) Filed: May 31, 2002

(65) Prior Publication Data

US 2002/0195138 A1 Dec. 26, 2002

(30) Foreign Application Priority Data

Jun. 1, 2001 (JP) ..................... 2001-166277

(51) Int. Cl.[7] .................. H01L 31/048; H01L 31/05
(52) U.S. Cl. ................. 136/251; 136/244; 136/291; 52/173.3
(58) Field of Search .................. 136/251, 244, 136/291; 52/173.3

(56) References Cited

U.S. PATENT DOCUMENTS

| | | | | |
|---|---|---|---|---|
| 5,180,442 A | * | 1/1993 | Elias | 136/251 |
| 5,590,495 A | * | 1/1997 | Bressler et al. | 52/173.3 |
| 6,101,073 A | * | 8/2000 | Takehara | 361/42 |
| 2002/0195136 A1 | * | 12/2002 | Takabayashi et al. | 136/244 |
| 2003/0000566 A1 | * | 1/2003 | Matsushita et al. | 136/244 |
| 2003/0075211 A1 | * | 4/2003 | Makita et al. | 136/244 |

FOREIGN PATENT DOCUMENTS

| | | |
|---|---|---|
| JP | 5-3430 | 1/1993 |
| JP | 11-270023 | 10/1999 |
| JP | 2001-60704 | 3/2001 |

* cited by examiner

*Primary Examiner*—Alan Diamond
(74) *Attorney, Agent, or Firm*—Fitzpatrick, Cella, Harper & Scinto

(57) ABSTRACT

A solar-cell-installed structure is disclosed in which a solar cell at least part of active electric portions of which stands exposed to surroundings is fixed onto a support placed on the ground, and the support is in only spot or line contact with the ground so that any leakage current can be small and the power loss can be lessened.

20 Claims, 10 Drawing Sheets

SOLAR-CELL-INSTALLED STRUCTURE, AND PHOTOVOLTAIC POWER GENERATION SYSTEM

BACKGROUND OF THE INVENTION

1. Field of the Invention

This invention relates to a solar-cell-installed structure at least part of active electric portions of which stands exposed to surroundings, and a photovoltaic power generation system making use of the solar-cell-installed structure. More particularly, it relates to those which are characterized by having achieved more reduction of power loss by controlling leakage current.

2. Related Background Art

A rise in consciousness of environmental problems is more worldwide spreading than ever. In particular, apprehensions for the phenomenon of earth warming which is accompanied by emission of $CO_2$ are serious, and there is an increasing eagerness for clean energy. At present, solar batteries can be said to be expectable as clean energy sources because of their safety and readiness to handle.

In recent years, various types have been proposed as forms of solar-battery assemblies. Besides the technical development on construction material integral-type solar battery in which a solar battery is incorporated in construction materials themselves, development is also made on conventional various stand installation systems.

Japanese Patent Application Laid-Open No. 11-270023 discloses a wall solar cell module the panel main body of which is formed of a concrete material. According to this publication, a solar cell module is integrally formed in a depression of a concrete panel and hence can be improved in building performance and maintenance performance.

Japanese Patent Application Laid-Open No. 2001-60704 discloses that a member on which a photoelectric transducer having a temporarily peelable film is to be attached may include concrete plates, slates, tiles and metal sheets. According to this publication, the temporarily peelable film constituting the photoelectric transducer brings about an improvement in construction (building or laying) performance and maintenance performance.

Japanese Utility Model Application Laid-Open No. 5-3430 discloses a power generation tile in which an opaque sheet is peelably fastened to the surface of a solar battery. According to this publication, in virtue of the sheet formed on the surface of a solar battery, the solar battery does not generate electric power during construction because it is covered with the sheet, promising safety during the construction, and also, in virtue of this sheet, the solar battery surface can be prevented from being scratched or contaminated during the construction.

Meanwhile, equipment of power plants or the like is all placed within controlled surroundings, and is placed in surroundings those who are not concerned, having no electrical knowledge, can not enter. Supposing such installation surroundings, development has been made on a solar battery some part of active electric portions of which stand exposed to surroundings.

FIGS. 11A and 11B are schematic views for illustrating a solar cell some part of electrodes of which stand exposed to surroundings. FIG. 11A illustrates a solar cell before formation of a weatherable coating film; and FIG. 11B, a solar cell after formation of the weatherable coating film. In the drawings, reference numeral 1101 denotes a photovoltaic device; 1102, a positive-pole electrode; 1103, a negative-pole electrode; and 1104, the weatherable coating film. Forming the weatherable coating film 1104 on the light-receiving side of the solar cell as shown in the drawings can make the solar cell have an outdoor weatherability. The part of the photovoltaic device 1101 is covered with the coating film to make the device have weatherability. However, the positive-pole electrode 1102 and the negative-pole electrode 1103 are not covered at least at the part electrically connected with an adjoining solar cell, and your hand can readily touch that part even after electrical interconnection has been made. Namely, the active electric portions partly stand exposed to surroundings.

However, in the case of solar-cell-installed structures in which supports are formed using, e.g., concrete materials, there has been a problem that the concrete materials may come to have a greatly low resistivity upon wetting, and hence electric current may greatly leak from the active electric portions standing exposed, resulting in a great power loss.

Moreover, such a great leakage current may unintentionally actuate a ground fault sensor of an inverter incorporated in the photovoltaic power generation system. As the result, the inverter may come inoperable.

SUMMARY OF THE INVENTION

An object of the present invention is to provide a solar-cell-installed structure which can lessen any leakage current flowing from solar cells, to reduce power loss.

Another object of the present invention is to provide a photovoltaic power generation system which can lessen any leakage current to prevent the inverter from stopping.

To achieve the above objects, the solar-cell-installed structure of the present invention comprises a solar cell at least part of active electric portions of which stands exposed to surroundings, and a support placed on the ground and on which support the solar cell is fixed, wherein the support is in only spot or line contact with the ground.

In the solar-cell-installed structure of the present invention, the support may preferably be formed of a concrete material.

A back support which supports the support may also preferably be provided on the non-light-receiving side of the support, where the support may preferably be in only spot or line contact with the back support. The support may be platelike, and may more preferably satisfy the relation of:

$$t > 1,307.9(0.71+0.016 \cdot \theta)/(d \cdot g \cdot \cos \theta),$$

where d is the density ($kg/m^3$) of the support, g is the acceleration of gravity ($m/s^2$) of the support, θ is the angle of inclination of the support from the ground, and t is the thickness (m) of the support.

In another embodiment of the present invention, the solar-cell-installed structure may also comprise a solar cell at least part of active electric portions of which stands exposed to surroundings, and a support placed on the ground and on which support the solar cell is fixed, wherein the support is in contact with the ground at least via an insulating member.

In this solar-cell-installed structure according to another embodiment of the present invention, the support may preferably be formed of a concrete material.

A back support which supports the support may also preferably be provided on the non-light-receiving side of the support, where the insulating member may more preferably be provided between the support and the back support. The support may be platelike, and may more preferably satisfy the relation of:

$$t>1,307.9(0.71+0.016\cdot\theta)/(d\cdot g\cdot \cos\theta),$$

where d is the density (kg/m$^3$) of the support, g is the acceleration of gravity (m/s$^2$) of the support, θ is the angle of inclination of the support from the ground, and t is the thickness (m) of the support.

The insulating member may also preferably have a surface tension of 28 mN/m or less.

The photovoltaic power generation system of the present invention comprises at least two solar-cell-installed structures (comprising the above solar-cell-installed structure) which are electrically interconnected, and an inverter provided internally with a ground fault sensor; the former interconnected structures being connected to the latter at the former's positive and negative terminals.

In the photovoltaic power generation system of the present invention, the solar-cell-installed structures may be connected in series, and may preferably satisfy the relation of R>5×V×N, where N is the number of the solar-cell-installed structures connected in series, V is the voltage (V) of the photovoltaic power generation system, and R is the electrical resistance (Ω) between solar cells and the ground.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENTS

Figure 1A:
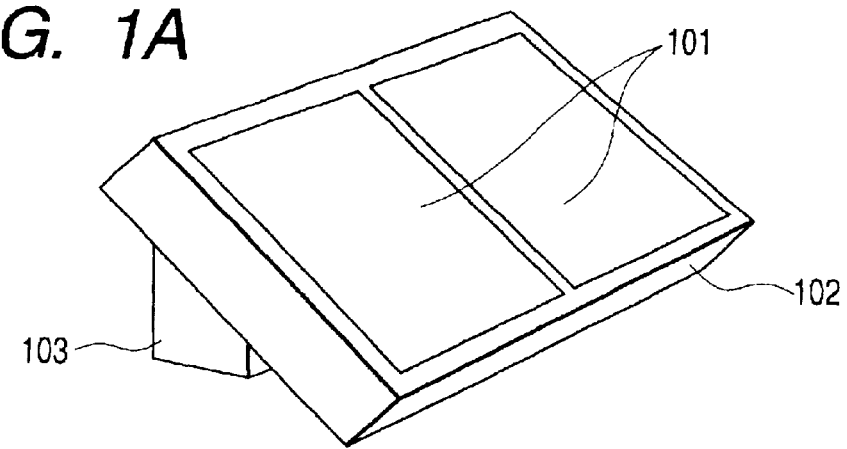
FIGS. 1A, 1B and 1C are schematic views showing an example of the solar-cell-installed structure of the present invention.
Figure 1B:
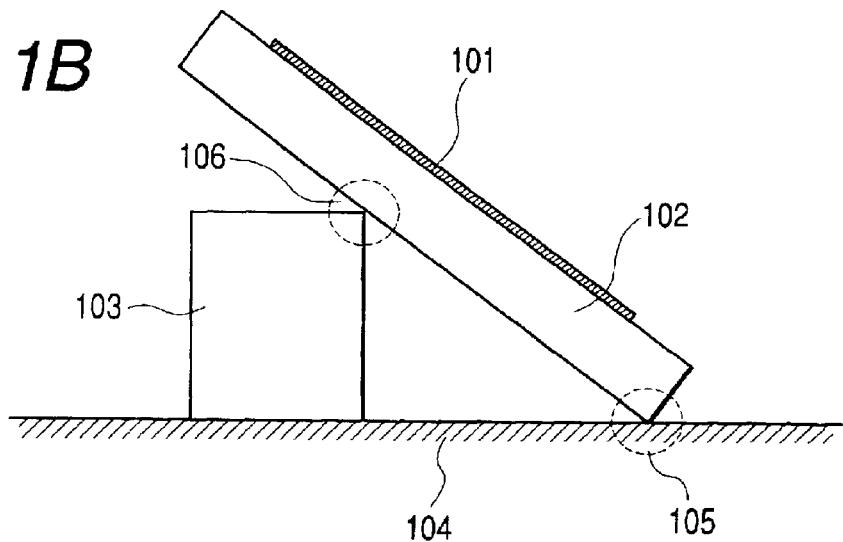
Figure 1C:
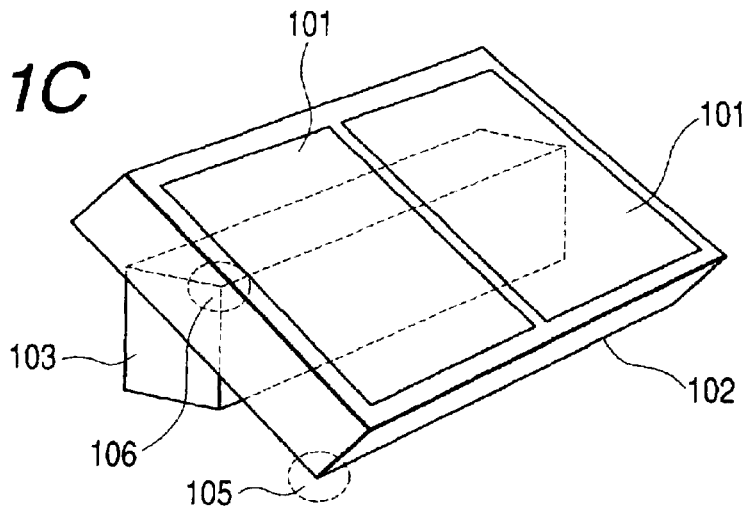

FIGS. 1A to 1C are schematic views for illustrating a solar-cell-installed structure of the present invention. In FIGS. 1A to 1C, reference numeral 101 denotes solar cells; 102, a support; 103, back support; 104, the ground; 105, a contact portion at which the support 102 comes into contact with the ground 104; and 106, a contact portion at which the support 102 comes into contact with the back support 103.

As shown in FIGS. 1A to 1C, the solar cells 101 are installed and fixed on the support 102. Then, the support 102 is rested against the back support 103 in such a way that the former leans on the latter so that the solar cells 101 are installed on an inclined plane. As constructed in this way, the support 102 comes into line contact (contact in a linear fashion) (105) with the ground 104 at the former's lower end, and comes into line contact (106) with the back support 103. Thus, the support 102 comes into contact with the ground 104 at two positions, i.e., between the support 102 and the ground 104 directly and between the support 102, the back support 103 and the ground 104 indirectly. Since the portions 105 and 106 coming into line contact lie between, the electrical resistance between the solar cells 101 and the ground 104 can be made large. Hence, any leakage current from the solar cells 101 to the ground 104 can be small, and the power loss can be lessened.

Figure 2A:
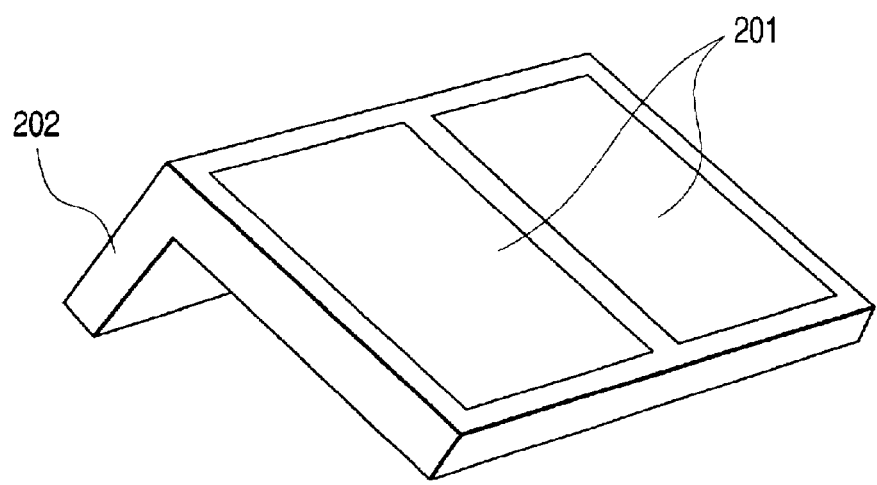
FIGS. 2A and 2B are schematic views showing another example of the solar-cell-installed structure of the present invention.
Figure 2B:
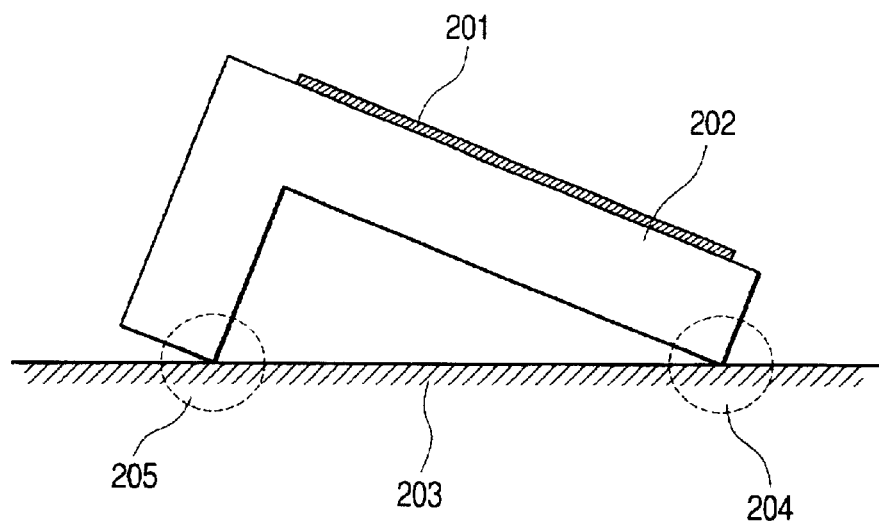

FIGS. 2A and 2B are schematic views for illustrating another solar-cell-installed structure of the present invention, not making use of any back support. In FIGS. 2A and 2B, reference numeral 201 denotes solar cells; 202, a support; 203, the ground; and 204 and 205, contact portions at which the support 202 comes into contact with the ground 203.

As shown in FIGS. 2A and 2B, where a support 202 having an L-shaped section is used, the support 202 is directly placed on the ground 203 in such a way that the support 202 forms an inclined plane on which the solar cells 201 are to be installed. Then the solar cells 201 are installed and fixed on the support 202. As constructed in this way, the support 202 comes into contact with the ground 203 at two contact portions 204 and 205 between the support 202 and the ground 203. Thus, the electrical resistance between the solar cells 201 and the ground 203 can be made great. Hence, any leakage current from the solar cells 201 to the ground 203 can be small, and the power loss can be lessened.

Figure 3A:
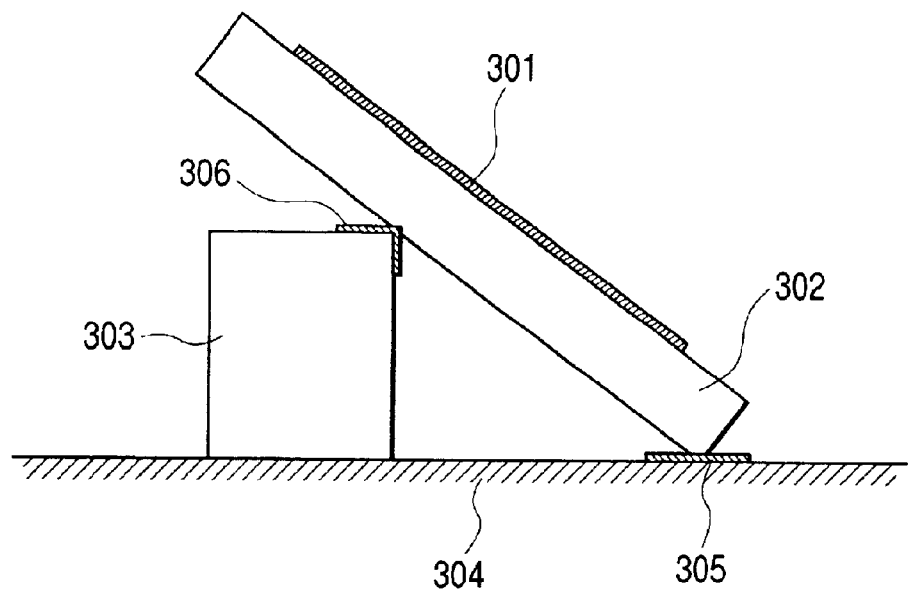
FIGS. 3A and 3B are schematic views showing still another example of the solar-cell-installed structure of the present invention.
Figure 3B:
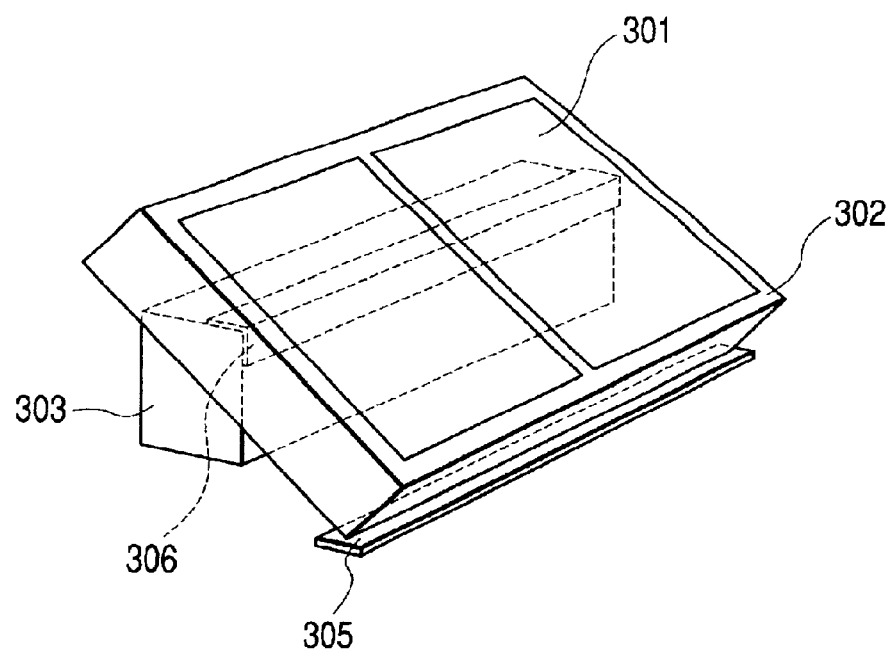

FIGS. 3A and 3B are schematic views for illustrating another solar-cell-installed structure of the present invention, the support of which comes into contact with the ground via insulating members. In FIGS. 3A and 3B, reference numeral 301 denotes solar cells; 302, a support; 303, a back support; 304, the ground; 305, an insulating member provided between the support 302 and the ground 304; 306, an insulating member provided between the support 302 and the back support 303. By making the insulating members 305 and 306 lie between the support 302 and the ground 304 in this way, the electrical resistance between the solar cells 301 and the ground 303 can be made great. Thus, any leakage current from the solar cells 301 to the ground 303 can be small, and the power loss can be lessened. In the structure shown in FIGS. 3A and 3B, there are two courses through which the leakage current passes. Even in the course extending via the back support 303, the leakage current can be controlled by placing the insulating member between the support 302 and the back support 303.

Figure 4:
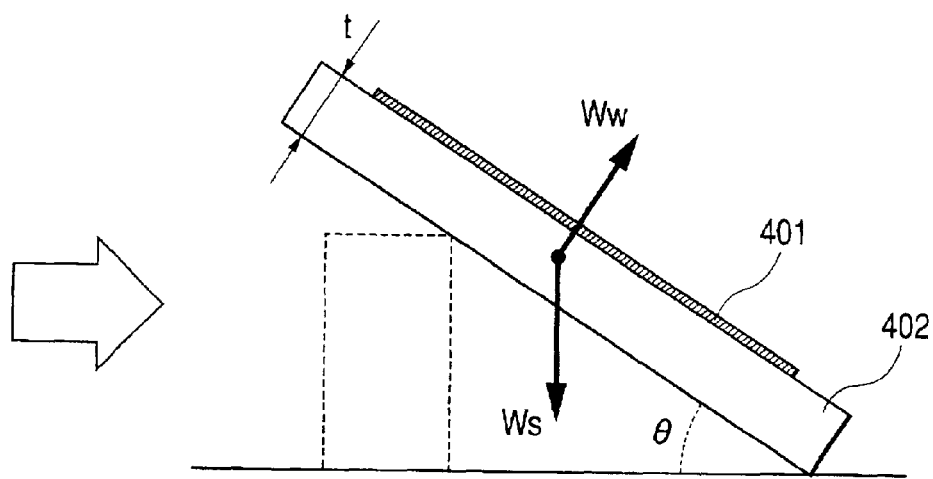
FIG. 4 is a schematic view for illustrating conditions under which the support does not move in a strong wind when it is platelike.

FIG. 4 is a schematic view for illustrating conditions under which the support does not move in a strong wind when it is platelike. In FIG. 4, reference numeral 401 denotes solar cells; 402, a support; θ, the angle (degrees) of inclination of the support 402; t, the thickness (m) of the support; Ws, the load (N) of the support 402; and Ww, the designing wind load (N).

The weight Ws of the support 402 is expressed as shown below:

$$Ws = A \cdot t \cdot d \cdot g (N) \qquad (1),$$

where d is the density (kg/m$^3$) of the support 402, g is the acceleration of gravity (m/s$^2$) of the support 402, and A is the light-receiving side area (m$^2$).

Then, the designing wind load Ww is expressed as shown below:

$$Ww = Cw \cdot q \cdot A (N) \qquad (2),$$

where Cw is the coefficient of wind power, q is the designing velocity pressure (N/m$^2$), and A is the wind-blown area (m$^2$).

Here, the coefficient of wind power Cw is expressed as shown below:

$$Cw = 0.71 + 0.016 \cdot \theta \qquad (3),$$

where θ is the angle of inclination of the support 402 on the ground.

The designing velocity pressure q is expressed as shown below:

$$q = \tfrac{1}{2} \cdot p V^2 \cdot \alpha \cdot l \cdot J,$$

where V is the designed wind velocity (m/s), ρ is the air density (N·s$^2$/m$^4$), α is the coefficient of height corrections, l is the coefficient of use, and J is the coefficient of surroundings.

When V=60 m/s, p=1.274 N·s$^2$/m$^4$, α=0.496 (the height of the support is set to be 30 cm), l=1.0 (in the case of commonly available solar cells) and J=1.15 (at a place free of any obstacles, e.g., on the sea), the designing velocity pressure q is calculated as shown below:

$$q = 1,307.9 (N/M^2) \qquad (4).$$

Expression (4) is established when the height of the support 402 is set to be 30 cm. Its value must be changed depending on places where the support 402 is to be placed.

The support 402 does not move as long as the following conditions are kept according to Expressions (1) and (2):

$$Ws \cdot \cos \theta > Ww \qquad (5).$$

Substituting Expressions (1) to (4) for Expression (5) to solve the thickness t of the support 402, it follows that:

$$t > 1,307.9 (0.71 + 0.016 \cdot \theta)/(d \cdot g \cdot \cos \theta) \qquad (6).$$

As long as the support 402 has the thickness satisfying the above relation, it does not move in a strong wind. Thus, an appropriate support thickness t must be determined by the density d and angle of inclination θ of the support 402.

The above calculation is made supposing the worst condition given when the back support is not provided and the wind blows against the whole back of the support 402. In fact, the support 402 is inclined by the aid of the back support, and hence it is not the case that the wind blows against the whole back surface. Thus, the structure can sufficiently be safe as long as the above conditions are fulfilled.

Figure 12A:
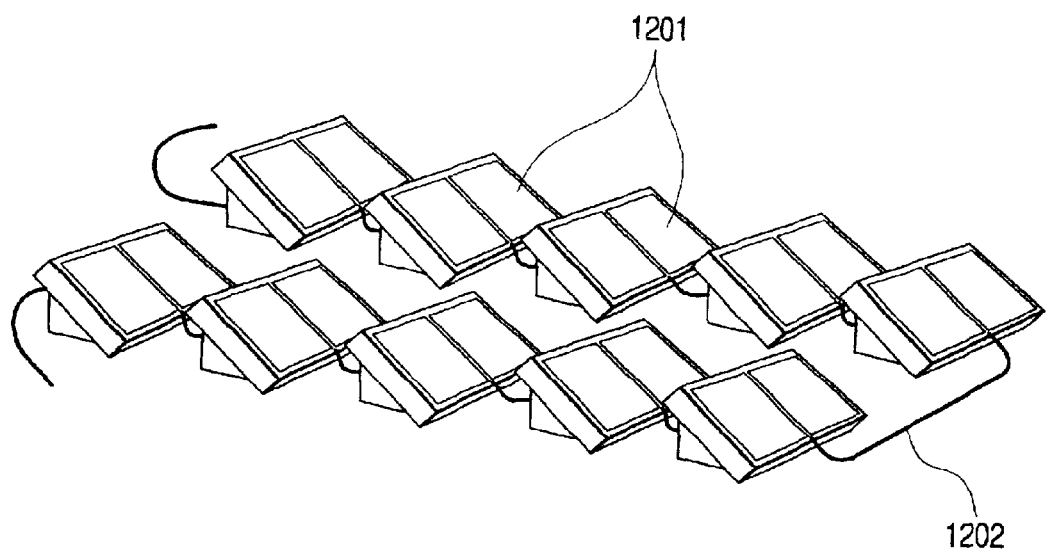
FIGS. 12A and 12B are schematic views showing an example of the photovoltaic power generation system of the present invention.
Figure 12B:
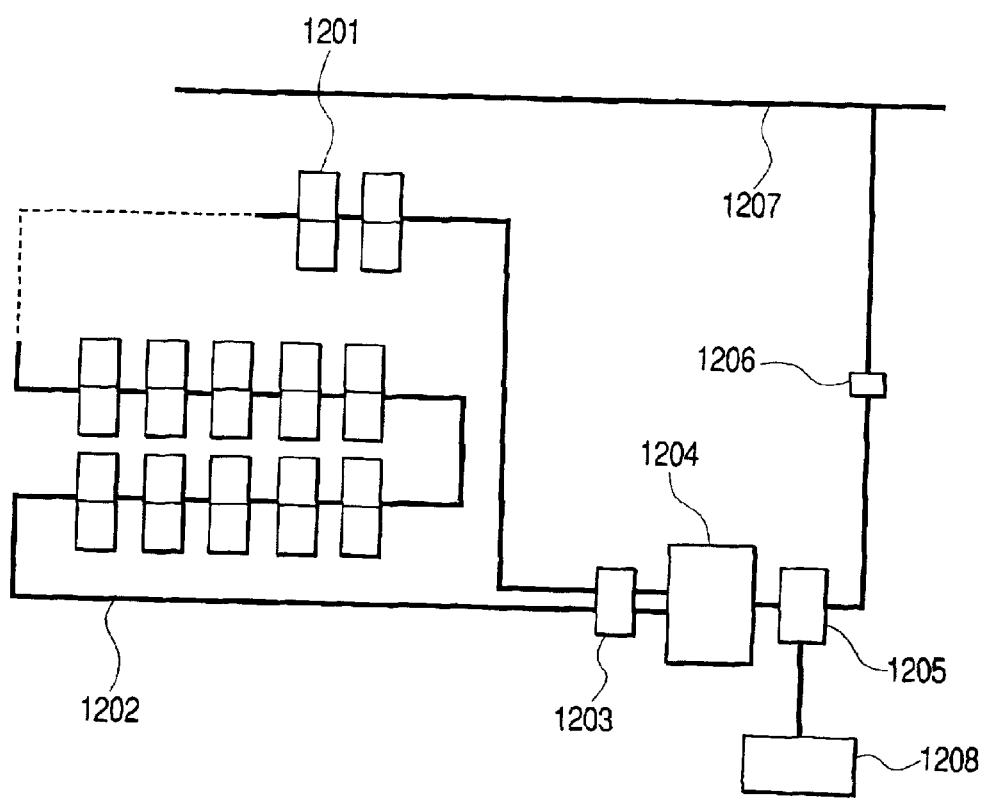

FIGS. 12A and 12B are schematic views for illustrating the photovoltaic power generation system of the present invention. FIG. 12A is a schematic view showing how solar-cell-installed structures are arranged, and FIG. 12B a diagrammatic view of a photovoltaic power generation system (line-connected system). In FIGS. 12A and 12B, reference numeral 1201 denotes solar cells; 1202, a wiring material; 1203, a connection box; 1204, an inverter provided internally with a ground fault sensor (not shown); 1205, a distribution switchboard; 1206, an ampere-hour meter; 1207, a system power circuit; and 1208, indoor electrical equipment.

A photovoltaic power generation system making use of the solar-cell-installed structures of the present invention can be set up by wiring as shown in FIG. 12B. In the photovoltaic power generation system of the present invention, electric power generated at the solar cells 1201 is put together in the connection box 1203, then DC-AC converted by the inverter 1204, and transmitted to the indoor electrical equipment 1208 via the distribution switchboard 1205. Here, when the electric power generated is in a large quantity and there is surplus electric power, such electric power may be transmitted to the system power circuit 1207 so that you may have an electric-power company buy the electric power. When conversely the electric power generated is in a small quantity or the electric power the indoor electrical equipment 1208 consumes is in a large quantity, the shortage may be made up from the system power circuit 1207 to buy the electric power from the electric-power company.

The electrical resistance between the solar cells and the ground and conditions under which any ground fault detection does not act unintentionally are described below.

The voltage (V) of solar cells on one solar-cell-installed structure (voltage after connection when connected in series) is represented by v, the electric current (A) of solar cells which flows through one solar-cell-installed structure (electric current after connection when connected in parallel) by 1, the number of solar-cell-installed structures connected in series by N, the voltage (V) of the photovoltaic power generation system by V (i.e., V=Nv), the electrical resistance (Ω) between the solar cells and the ground by R, and the leakage current (A) from each solar cell to the ground by lr.

Assume that the solar-cell-installed structures are connected in series, the leakage current lr at a solar-cell-installed structure on the negative-pole terminal side is small, and on the other hand the leakage current lr at a solar-cell-installed structure on the positive-pole terminal side is large because of its high ground fault voltage. Here, on the assumption that all the solar-cell-installed structures have the voltage to ground of a solar-cell-installed structure middle-positioned in the solar-cell-installed structures connected in series, all the solar-cell-installed structures are considered to have the like leakage current Ir. In such a case, the voltage to ground of each solar-cell-installed structure is expressed by Nv/2, i.e., V/2. Hence, the leakage current lr at each single solar-cell-installed structure is expressed as:

$$V/2 = R \cdot lr \qquad (7).$$

When this is dissolved in respect of lr, it follows that:

$$Ir = V/(2 \cdot R) \qquad (8).$$

Since also the electric power is the product of voltage and electric currents, it may be considered that the loss of electric current is the power loss. Further, as conditions for the power loss in the whole system, the power loss at each solar-cell-installed structure may be taken into account. Therefore, the power loss is expressed as shown below:

$$Ir/I \times 100 = 50V/(R \cdot I)(\%) \qquad (9).$$

Conditions for the electrical resistance R between the solar cells and the ground, under which the power loss comes to 1% or less are given as shown below:

$$50V/(R \cdot I) < 1.$$

Therefore, it follows that:

$$R > 50V/=I \qquad (10).$$

As long as the electrical resistance R between the solar cells and the ground fulfills the conditions of Expression (10), the power loss can be made 1% or less.

Meanwhile, in the case of a general-purpose inverter, the level of common ground fault detection is 100 mA. Hence, from Expression (8), which expresses the leakage current Ir from one solar cell to the ground, the leakage current in N solar-cell-installed structures as a whole come to be as shown below:

$$Ir \times N = V \times N/(2 \cdot R) \qquad (11).$$

Therefore, in order that the leakage current does not come to the ground fault detection level 100 mA, $$V \times N/(2 \cdot R) < 0.1 \text{ and,}$$

$$R > 5 \times V \times N \qquad (12).$$

As long as the electrical resistance R between the solar cells and the ground fulfills the conditions of the above Expression (12), the ground fault detection can be prevented from acting unintentionally and thereby the inverter can be prevented from stopping to operate.

Members constituting the solar-cell-installed structure of the present invention are described below in greater detail.

Solar Cells

The structure (structural product) of the present invention has a very simple structure that the solar cells are fixed on the support. Accordingly, taking account of long-term reliability, the solar cells may preferably be of a type which is thin and light-weight. As the solar cells, usable are, but not particularly limited to, e.g., photovoltaic devices constituted of amorphous silicon formed on a stainless-steel substrate. Such construction can make the structure thin-gauge and light-weight, and is very favorable for the manufacture of solar-cell-installed structure. Also, such photovoltaic devices constituted of amorphous silicon formed on a stainless-steel substrate are structurally flexible, and hence can be bonded and fixed to the support even when, e.g., its plane on which the structures are to be placed is curved surface.

Figure 5:
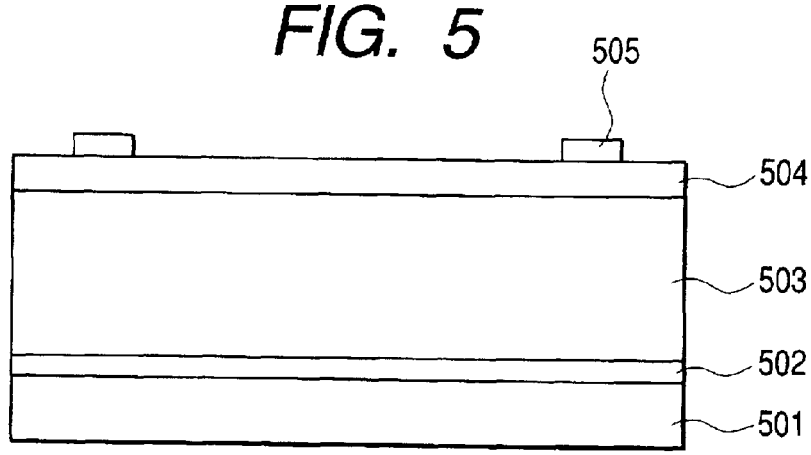
FIG. 5 is a schematic view for illustrating the construction of a photovoltaic device.

The solar cells making use of photovoltaic devices constituted of amorphous silicon formed on a stainless-steel substrate may be produced, e.g., in the following way. The production of a photovoltaic device is described first. FIG. 5 is a schematic view for illustrating the construction of a photovoltaic device. In FIG. 5, reference numeral 501 denotes a stainless-steel substrate; 502, a metal electrode layer; 503, a semiconductor photoelectric layer; 504, a transparent conductive layer; and 505, a collector electrode.

First, on the stainless-steel substrate 501, having been cleaned, an Al layer and a ZnO layer are formed by sputtering in order as the metal electrode layer (or light-reflecting layer) 502 on the back-side. Then, an a-Si (amorphous silicon) semiconductor photoelectric layer 503 is formed by plasma CVD. Next, as the transparent conductive layer 504, an $In_2O_3$ thin film is formed by vacuum deposition according to a resistance heating method. Then, a silver paste is applied by screen printing or the like to form the collector electrode 505.

Figure 6:
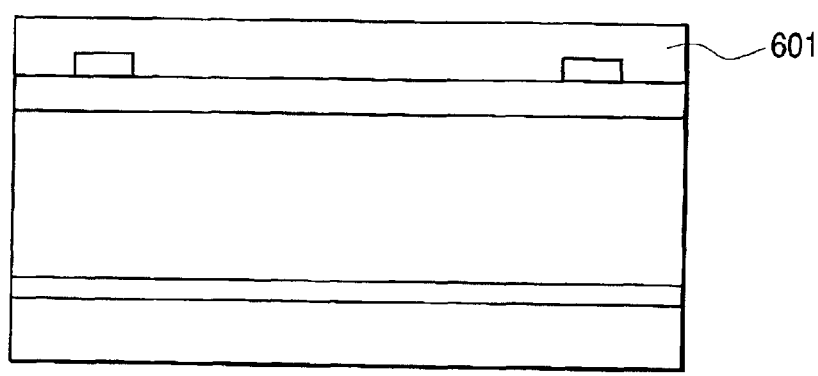
FIG. 6 is a schematic view for illustrating a weatherable coating film.

Next, in order to provide weatherability, a weatherable coating film of, e.g., an acrylic type is formed on the photovoltaic device. FIG. 6 is a schematic view for illustrating the weatherable coating film. In FIG. 6, reference numeral 601 denotes the weatherable coating film. Forming the coating film on the light-receiving side of the photovoltaic device as shown in FIG. 6 enables the device to be provided with weatherability. Thus, a solar cell can be produced.

Solar-cell-installed Structure

The solar-cell-installed structure termed in the present invention is meant to be one in which the solar cells and the support are integrally set up, or, in some cases, one which has the support and the back support. The solar cells may be fixed on the support by fastening them with metal fixtures or by direct bonding. Where the support is made of a material having a large weight such as concrete, it may only be placed on the ground to finish the placement of a stand (support). Also, in the case when it is constituted to have the back support and is likewise a support having a large weight, it may only be placed on the back support. With such constitution, a solar-cell-installed structure having a simple structure and good construction performance can be provided.

Support

The support is meant to a member on which the solar cells are to be fixed. In a solar battery system, it refers to a member which commonly form a stand or an installation plane.

In the present invention, because of simple structure and easy installation work, concrete is preferably used. Where the support is made of a material having a large weight such as concrete, it may only be placed on the ground to finish the placement of a stand (support). Also, since the concrete has a high outdoor durability and is inexpensive, it is favorable for use as a stand of the solar cells.

The support may also be platelike, where the structure can be formed using the support and the back support separately, and hence the support may be placed after the back support has been placed. This is favorable because the angle of installation can arbitrarily be changed.

In the case when the support is platelike, it may also preferably satisfy, as described previously, the relation of:

$$t > 1,307.9(0.71 + 0.016 \cdot \theta)/(d \cdot g \cdot \cos \theta),$$

where d is the density (kg/m$^3$) of the support, g is the acceleration of gravity (m/s$^2$) of the support, θ is the angle of inclination of the support from the ground, and t is the thickness (m) of the support. Fulfillment of these conditions enables the support to be prevented from moving in a strong wind (wind velocity of, e.g., 60 m/s).

As the shape of the support, in the case when the back support is not used, the support must have such a shape that it can come into only spot or line contact with the ground. For example, it may have the L-shape as shown in FIGS. 2A and 2B. Also, in the case when the back support is used, a platelike rectangular solid may preferably be used. The use of such a rectangular solid can make the support come into spot or line contact with respect to the ground or the back support as shown in FIGS. 1A to 1C. Hence, the electrical resistance between the solar cells and the ground can be made great, and any leakage current can be small.

As a material for the support, it may preferably be a material having outdoor durability, having large weight and having great electrical resistance. For example, concrete, stone materials, and metals insulation-treated on their surfaces may be used.

Back Support

The back support is a member placed on the back side of the support, and may be unnecessary depending on the shape of the support. It may preferably be used because it is usable as a bolster member for the platelike support and the angle of inclination of the support can arbitrarily be changed. As its shape, a rectangular solid may be used. Also, since a material having a large weight is used as the support, the back support may preferably be made of a material having a high compression strength and a high outdoor durability. Concrete, stone materials, brick or the like may be used as the material.

Active Electric Portions of Solar Cells, and Their Exposure to Surroundings

The active electric portions of the solar cells in the present invention are in such a state that you can touch them with ease, and differ from, e.g., connectors having been used at electrically connecting portions of conventional solar batteries. Electrodes of the connectors can be touched if a finger is inserted thereto, but do not correspond to the active electric portions in the present invention.

Figure 11A:
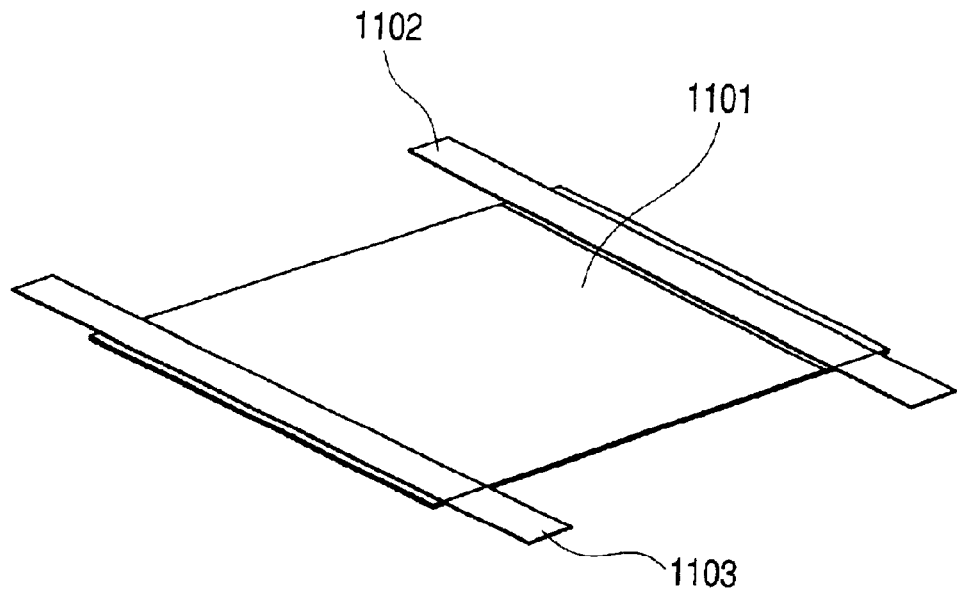
FIGS. 11A and 11B are schematic views for illustrating a solar cell some part of electrodes of which stands exposed to surroundings.
Figure 11B:
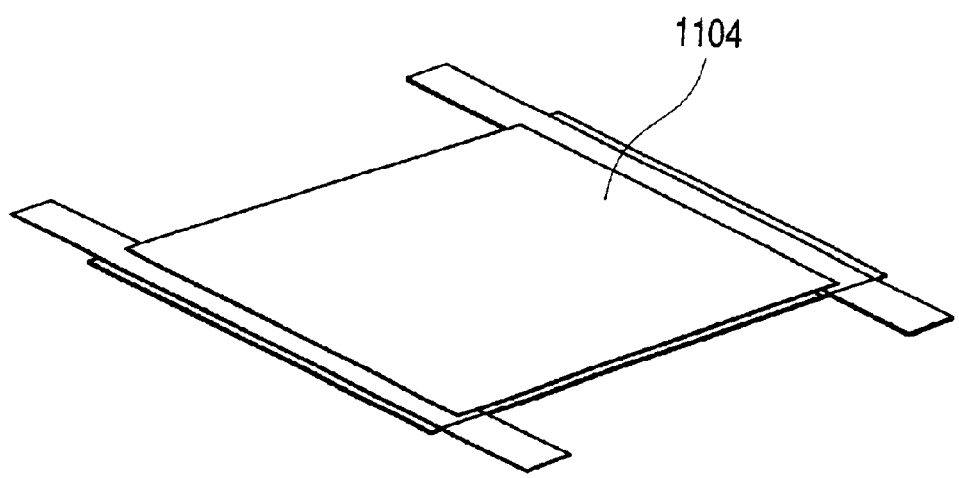

For example, FIGS. 11A and 11B are schematic views of a solar cell used in the present invention. As shown in FIGS. 11A and 11B, the solar cell is covered with a weatherable coating film 1104 at its photovoltaic portion, but is not completely covered therewith at its positive- and negative-pole terminals 1102 and 1103. Thus, it follows that the electrode portions stand exposed to surroundings. The solar cell is fixed onto the support, but the electrode portions 1102 and 1103 stand exposed even on the support, and hence you can touch the electrodes with ease.

Equipment of power plants or the like is all placed within controlled surroundings, and is placed in surroundings those who are not concerned, having no electrical knowledge, can not enter. The solar-cell-installed structure of the present invention the active electric portions of which stand exposed to surroundings may also preferably be placed within controlled surroundings as in the power plants.

Spot Contact, Line Contact

The solar-cell-installed structure of the present invention comes into line or spot contact with the ground, and hence the electrical resistance between the solar cells and the ground can be made great. For this reason, even in the case when the active electric portions stand exposed to surroundings, any leakage current from the solar cells to the ground can be small, and the power loss can be kept from being caused.

However, when the line contact or spot contact is termed in the present invention, such contact may of course have area to a certain extent. A support having a large weight may differ in the extent to which the ground goes down, depending on whether the ground is hard like concrete or is soft like soil, and hence may come to differ in the area of contact of the support with the ground. Preferably, in the case of line contact, the line may be within 5 mm in width. In the case when the ground is formed of soft material like soil, it is difficult for the line contact to materialize the line within 5 mm in width. Hence, it is better to place the support on the ground interposing the insulating member between them.

Where the support is little inclined like a case in which the angle of inclination is 0 degree, the support may come into contact with the ground in a large area via water when it rains, because of the surface tension of the water. Accordingly, it is better for the support to have a certain degree of inclination, e.g., an angle of inclination of 15 degrees or more. Also, in many cases the corners of the support are finished to have the shape of right angles. Hence, in such cases, an inclined plane of 75 degrees or less may be provided, which is favorable because the planes adjoining to each other fall at 15 degrees or more with respect to the ground.

Insulating Member

The insulating member is used in order to make the electrical resistance much greater. FIGS. 3A and 3B are schematic views for illustrating the insulating member (what reference numerals denote in the drawings have already been described). When used, the insulating member may be so placed as to be held between the support and the ground and between the support and the back support, on the courses through which the leakage current may flow. Thus, the electrical resistance between the solar cells and the ground can be made fairly great and any leakage can be fairly small.

As properties required for the insulating member, it may have outdoor durability, resistance to light, electrical insulation properties, water resistance and so forth. As specific materials therefor, silicone resins, fluorine resins and so forth may be used.

The insulating member may also preferably have a smaller surface tension. One having a small surface tension is well waterproof and repels water immediately, and hence the leakage current may flow with difficulty. Resins having a high water repellency, such as fluorine resins, commonly have a surface tension of from 25 to 28 mN/m. Accordingly, the insulating member also may preferably have a surface tension of 28 mN/m.

Figure 7A:
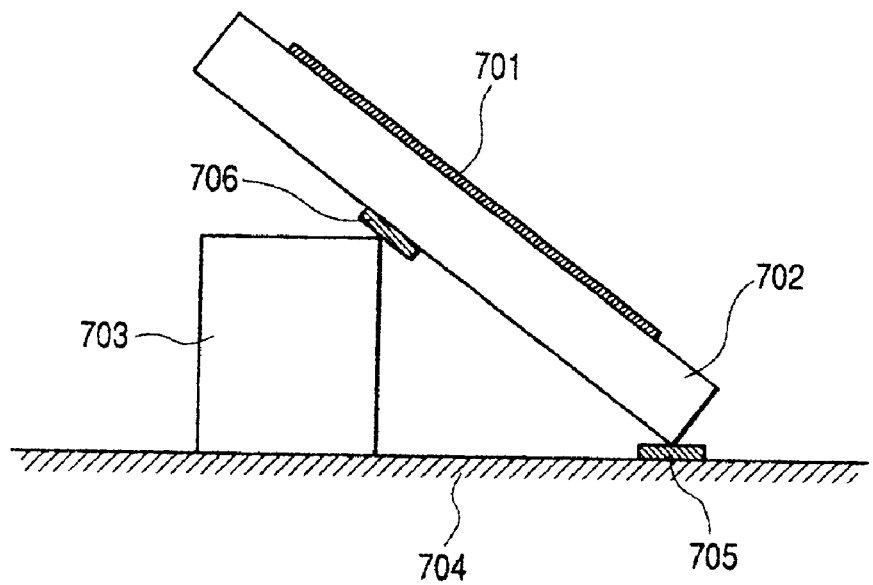
FIGS. 7A and 7B are schematic views showing a further example of the solar-cell-installed structure of the present invention.
Figure 7B:
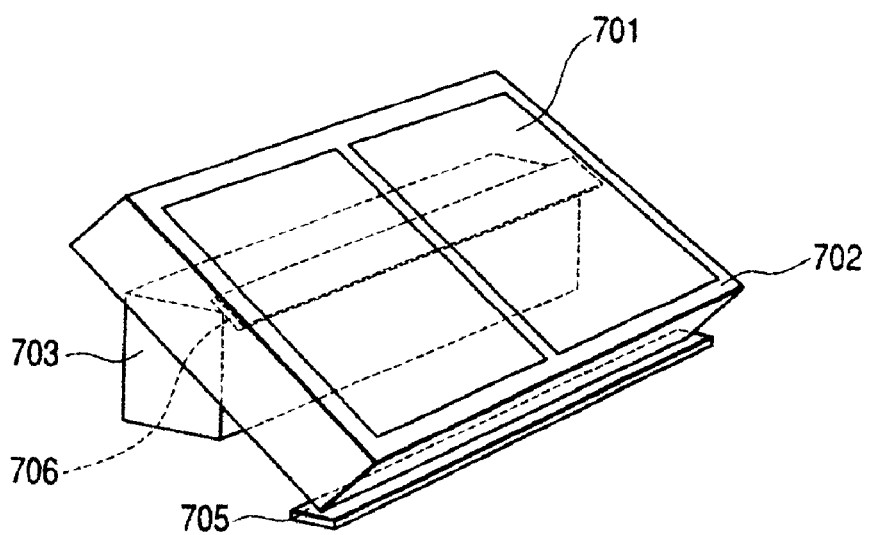

As its shape, it may be sheetlike, and besides may have a certain thickness so that it may be used to serve as a spacer. FIGS. 7A and 7B are schematic views for illustrating an insulating member used to serve as a spacer. In FIGS. 7A and 7B, reference numeral 701 denotes solar cells; 702, a support; 703, a back support; 704, the ground; 705, an insulating member provided between the support 702 and the ground 704; and 706, an insulating member provided between the support 702 and the back support 703. When used to serve as a spacer, the load of the support concentrates on the insulating members 705 and 706, and hence they must be those not only having outdoor durability but also well durable to compression stress.

To compare the insulating members 705 and 706 shown in FIGS. 7A and 7B, it is very effective to place the insulating member 705 at the part where the support 702 comes directly into contact with the ground. The reason therefor is that, since the raindrops flow downward, the part kept wet without drying for long is the part of the insulating member 705. Accordingly, where the insulating member is placed at only one position in the example shown in FIGS. 7A and 7B, it should be placed between the support 702 and the ground 704 in order to more lessen the leakage current.

The present invention is described below in greater detail by giving Examples.

EXAMPLE 1

The production of the solar-cell-installed structure of the present invention is described below.

First, solar cells were produced. Procedure for their production is described with reference to FIG. 5 (what reference numerals denote in the drawing have already been described).

First, a photovoltaic device constituted of a thin-film semiconductor (a-Si) was produced.

On a stainless-steel substrate of $125 \times 10^{-6}$ m thick, having been cleaned, an Al layer (layer thickness: $5 \times 10^{-7}$ m) and a ZnO layer (layer thickness: $5 \times 10^{-7}$ m) were formed by sputtering in order as the back-side metal electrode layer 502. Then, n-type a-Si layers were formed from a mixed gas of $SiH_4$, $PH_3$ and $H_2$, i-type a-Si layers from a mixed gas of $SiH_4$ and $H_2$, and p-type microcrystalline Si ($\mu c$-Si) layers from a mixed gas of $SiH_4$, $BF_3$ and $H_2$ all by plasma CVD to form a tandem type a-Si semiconductor photoelectric layer 503 having layer construction of an n-type layer with a layer thickness of $15 \times 10^{-9}$ m, an i-type layer with a layer thickness of $4 \times 10^{-7}$ m, a p-type layer with a layer thickness of $1 \times 10^{-8}$ m, an n-type layer with a layer thickness of $1 \times 10^{-8}$ m, an i-type layer with a layer thickness of $8 \times 10^{-8}$ m and a p-type layer with a layer thickness of $1 \times 10^{-8}$ m. Next, as the transparent conductive layer 504, an $In_2O_3$ thin film (layer thickness: $7 \times 10^{-8}$ m) was formed in an atmosphere of $O_2$ by vacuum deposition according to a resistance heating method. Then, the collector electrode 505 was further formed using a silver paste by screen printing followed by high-temperature treatment in an oven.

Finally, as shown in FIG. 6, the weatherable coating film 601 was formed. As the weatherable coating film 601, an acrylic coating material was used, which was coated by air spray coating, followed by curing in an oven to form a coating film of 120 $\mu$m in thickness.

Solar cells were produced by the above production process, each having external dimensions of 240 mm×360 mm in size. Also, their rating was Vpm=1.4 V and lpm=4.6 A.

Next, as the support a concrete plate was produced. The concrete plate was made in external dimensions of 500 mm in height, 800 mm in length and 100 mm in thickness, and was provided with an iron mesh (3 mm in wire diameter×50 mm □) at the middle in its plate thickness. The unit "□" represents length of one side of a mesh lattice. As a material, commonly available Portland cement was used.

Here, the thickness of the concrete plate comes to t>0.0797 m where $\theta$=30 degrees, d=2,300 kg/m³ and g=9.8 m/s² were substituted for Expression (6), i.e., t>1,307.9 (0.71+0.016·$\theta$)/(d·g·cos $\theta$). Therefore, it is unnecessary to worry about the moving of the support even in a strong wind of as high as 60 m/s in wind velocity, as long as it has the thickness of 100 mm.

As the back support, a general-purpose constructional concrete block was used. It had dimensions of 190 mm in height, 390 mm in length and 190 mm in thickness.

How to set up the solar-cell-installed structure of the present invention by the use of the above materials is described below. FIGS. 1A to 1C are schematic views for illustrating how to set up the solar-cell-installed structure of the present invention (what reference numerals denote in the drawings have already been described).

First, the constructional concrete block used as the back support 103 was placed on the ground concrete surface. Next, the support 102 was placed on the back support 103 in such a way that the former leaned on the latter. Also, the support 102 was set at an angle of inclination of 30 degrees.

At the part of contact of the support 102 with the ground 104, spots of 3 mm or less in diameter ranged discontinuously over the length of 800 mm of the support 102. At the part of contact of the support 102 with the back support 103, too, spots of 3 mm or less in diameter ranged likewise discontinuously over the length of 390 mm of the back support 103.

Thereafter, the solar cells 101 were bonded to the surface of the support 102. Here, an adhesive was applied to the peripheries (boundary areas) of the solar cells 101 on their back side, and the two solar cells produced as described above were bonded to the installation surfaces of the support 102. As the adhesive, an epoxy elastic adhesive (PM165, available from Cemedine Co., Ltd.) was used. Also, when bonded, the solar cells 101 were bonded pressing the peripheries of the solar cells 101.

After the two solar cells 101 were bonded and fixed to the surface of the support 102, they were connected in parallel on the support 102.

As having been set up as described above, it follows that the support 102 comes into contact with the ground 104 directly and indirectly at two positions 105 and 106 between the support and the ground and between the support and back support, respectively. At both the positions 105 and 106, the support is in line contact, and a high electrical resistance can be given between the solar cells 101 and the ground 104.

Figure 8:
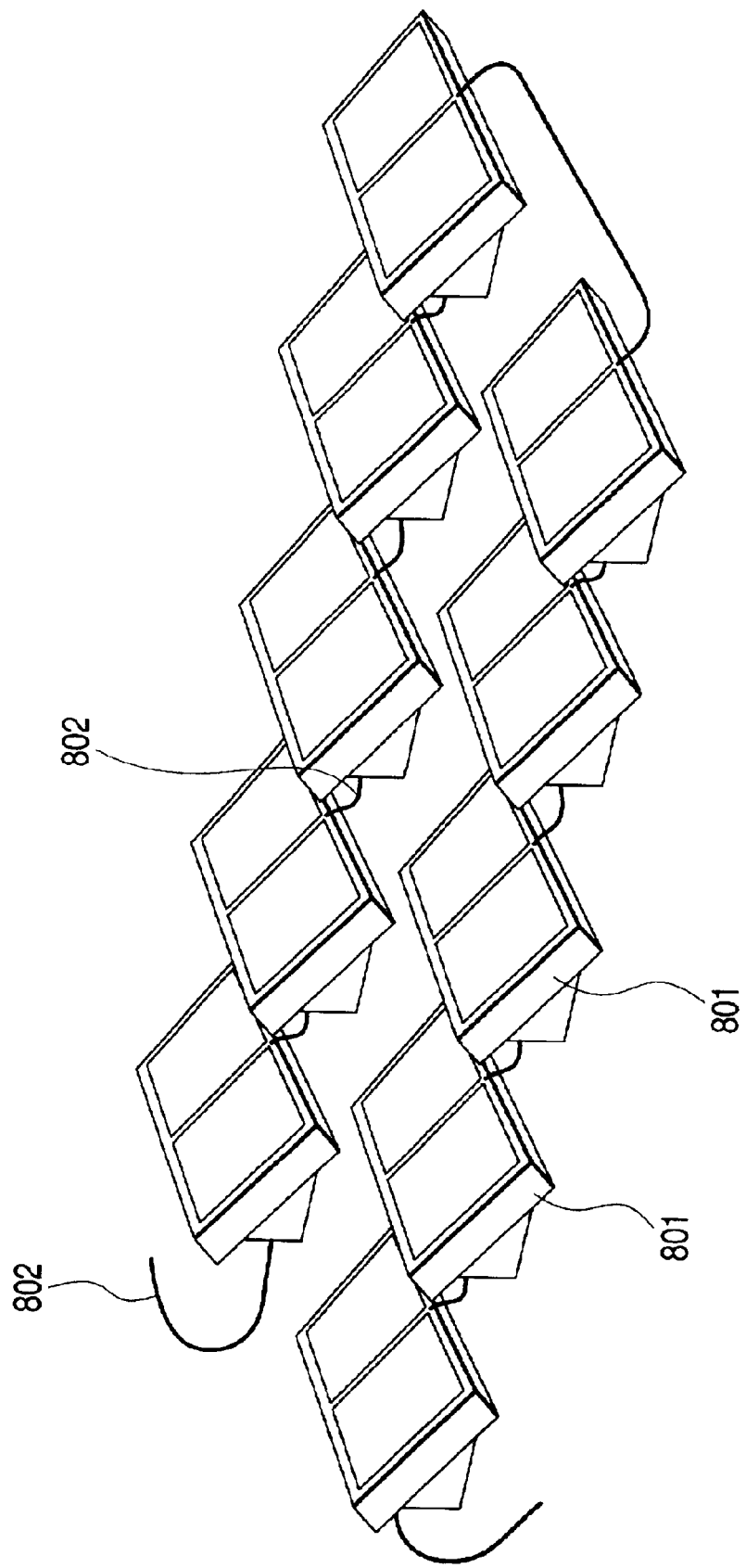
FIG. 8 is a schematic view for illustrating solar-cell-installed structures of an Example which are connected in series.

FIG. 8 is a schematic view for illustrating solar-cell-installed structures of this Example which are connected in series. In FIG. 8, reference numeral 801 denotes solar-cell-installed structures; and 802, wiring materials. As shown in FIG. 8, after the solar-cell-installed structures 801 are arranged, the solar cells on the supports were electrically interconnected through the wiring materials 802. This operation was repeated, and forty solar-cell-installed structures were connected in series. Then, the total voltage of the photovoltaic power generation system was set to be 56 V.

In the solar-cell-installed structure produced in this Example, the electrical resistance between the solar cells and the ground is measured as described below.

Figure 10:
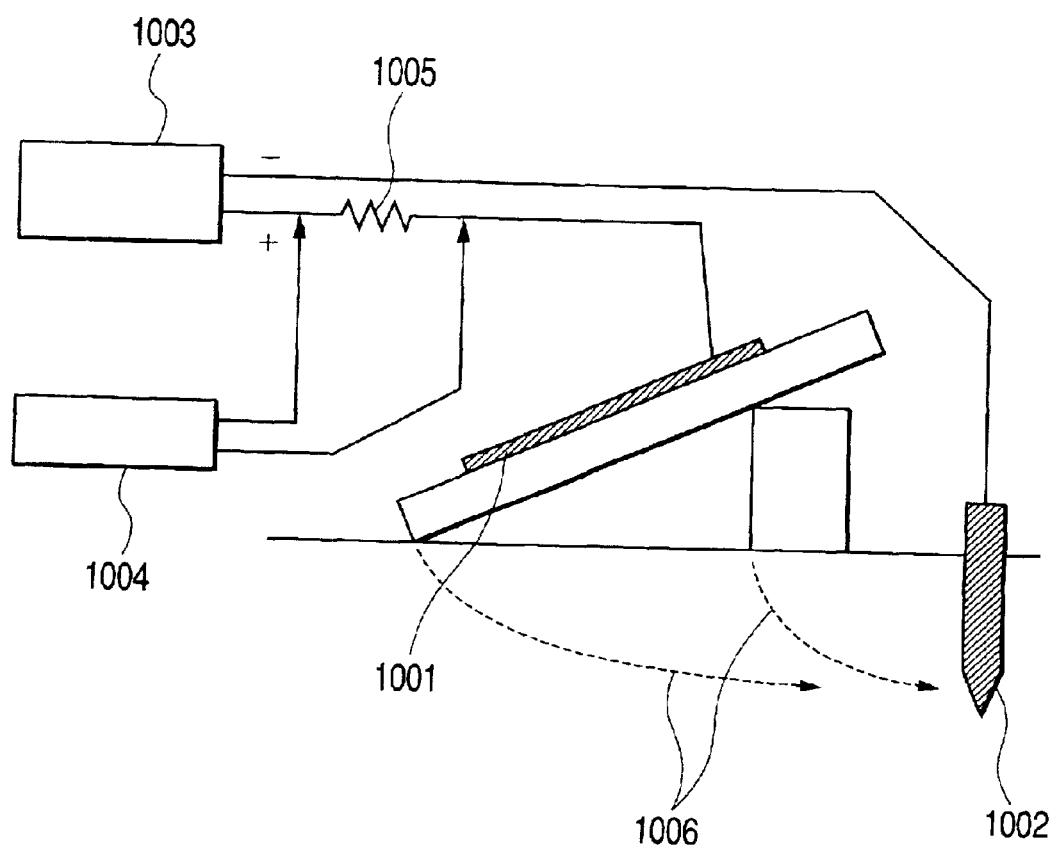
FIG. 10 is a schematic view for illustrating the measurement of electrical resistance between solar cells of a solar-cell-installed structure and the ground.

FIG. 10 is a schematic view for illustrating the measurement of the electrical resistance between the solar cells of the solar-cell-installed structure and the ground. In FIG. 10, reference numeral 1001 denotes solar cells; 1002, a grounding metal rod; 1003, a constant-voltage power source; 1004, a digital multiple meter; 1005, a shunt resistor; and 1006, leakage current. As shown in FIG. 10, a voltage is applied by the constant-voltage power source across the solar cells 1001 and the ground (grounding metal rod 1002). In order to detect the leakage current 1006 flowing when the voltage is applied, the voltage at the both terminals of the shunt resistor 1005 is monitored on the digital multiple meter. Here, as each measuring wiring material, an IV wire having a sectional area of 2 mm² was used. "IV wire" means an outdoor wiring. Also, as the grounding metal rod 1002, one having a ground resistance of 10Ω was used.

On the support, two solar cells (external dimensions: 240 mm×350 mm) were connected in parallel. When the voltage is applied, the positive and negative poles were short-circuited and the voltage was applied across the short-circuited portions and the grounding metal rod 1002. The voltage was applied under conditions of 50 V, 100 V, 200 V and 300 V. Also, as the shunt resistor 1005, one having 1Ω was used.

As portions coming into contact with the support, other than the solar cells, there are positive- and negative-pole electrodes and parallel-connected portions. Any leakage current from these portions coming into contact with the support is also possible. However, even in a connection form different from that in this Example (series or parallel connections are different), the leakage current from these positive- and negative-pole electrodes and parallel-connected portions can not be considered to have influence on this measurement, because these contact portions have sufficiently smaller area than the area of the solar cells and also because the positive- and negative-pole electrodes and the whole parallel-connected portions are not positively fixed onto the support in close contact.

The value of applied voltage and that of leakage current which have been found by this measurement have the relation of being represented by the linear-function straight line according to the Ohm's law. From the slope of this straight line, the electrical resistance between the solar cells and the ground can be determined. Here, to provide the worst conditions, the measurement was made spraying city water (electric conductance: 150 µs/m (microsiemens per meter)) sufficiently on the support, solar cells and back support. By the way, since common rain water has an electric conductance of 10 to 100 µs/m, the measurement is made under severer conditions, i.e., conditions which make the electricity flow very easily.

This measurement revealed that the electrical resistance between the solar cells and the ground per one solar-cell-installed structure was 800Ω.

This electrical resistance also comes to be R>304Ω where l=4.6 A×2 and V=56 V are substituted for Expression (10), i.e., the relation of R>50V/l, which represents conditions under which the power loss can be controlled within 1%. Hence, as long as it is 304Ω or more, the power loss can be controlled within 1%. Since in this Example it is 800Ω, the power loss can be said to be sufficiently low.

Thus, according to the solar-cell-installed structure of this Example, the following effects can be expected.

Since the support is in only line contact with the ground, a high electrical resistance can be provided between the solar cells and the ground, any leakage current from the solar cells to the ground can be small, and the power loss can be lessened.

Since the support is platelike, its thickness comes to be t>0.0797 from Expression (6) where the density of the support is 2,300 kg/m$^3$, the acceleration of gravity of the support is 9.8 m/s$^2$, the angle of inclination of the support from the ground is 30 degrees and the thickness of the support is represented by t (m). Hence, it is unnecessary to worry about the moving of the support even in a strong wind (wind velocity: 60 m/s).

Thus, solar-cell-installed structures having higher reliability can be provided.

EXAMPLE 2

A solar-cell-installed structure was set up in the same manner as in Example 1 except that the shape of the support was an L-shape, the back support was not used and the ground was soil.

FIGS. 2A and 2B are schematic views for illustrating the solar-cell-installed structure of this Example (what reference numerals denote in the drawings have already been described). The support was 450 mm in height and 600 mm in length on its side where the solar cells were to be bonded, and was set at an angle of inclination of 21 degrees. Also, the support in this Example, when wind blows against it, is pressed against the ground on its front (the plane on which the solar cells 201 are fixed) and back. Hence, it is unnecessary to worry about the moving of the support. Also, when wind blows against one side of the support, it is blown only in a small area, and hence it is unnecessary to worry about the moving of the support.

The part of contact of the support 202 with the ground 203 was substantially in a straight line although its width varied over the length of 600 mm of the support. The straight line was 5 mm in width at maximum.

Except the foregoing, solar-cell-installed structures were set up in the same manner as in Example 1 in respect of the manner of fixing the solar cells, the placement of solar-cell-installed structures and the manner of wiring between those connected in series.

Then, in the state the solar-cell-installed structures set up in this Example were completely wet with rain water, the electrical resistance between the solar cells and the ground was measured to find that it was 650Ω per one solar-cell-installed structure. It was measured in the same manner as in Example 1. From this result, it can be said that the power loss has well been kept from being caused.

Thus, according to the solar-cell-installed structure of this Example, the following effects can be expected.

Since the support is in only spot or line contact with the ground, a high electrical resistance can be provided between the solar cells and the ground, any leakage current can be small, and the power loss can be lessened.

Since the support is in an L-shape, the back support is unnecessary, promising very good construction performance.

EXAMPLE 3

A solar-cell-installed structure was set up in the same manner as in Example 1 except that an insulating member was placed between the support and the ground.

Figure 9A:
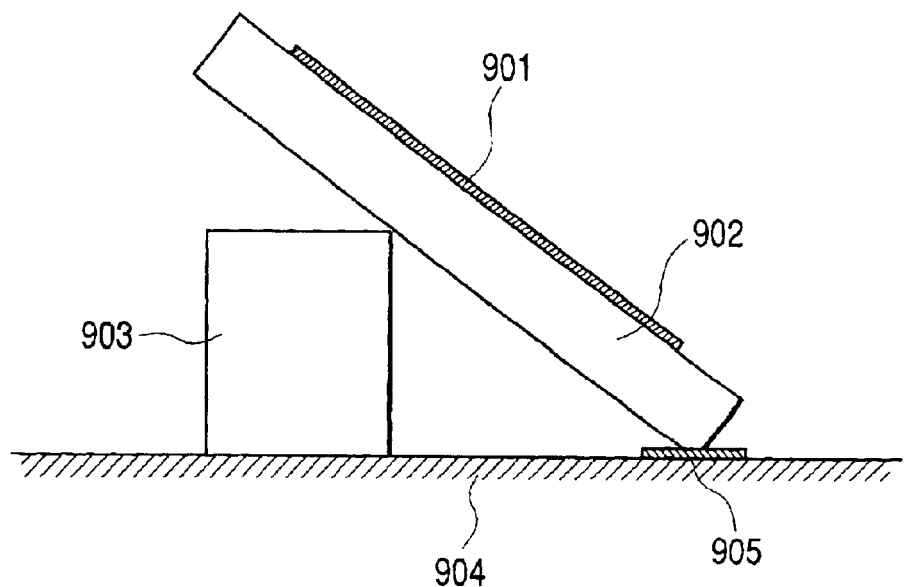
FIGS. 9A and 9B are schematic views showing a solar-cell-installed structure of Example 3 in the present invention.
Figure 9B:
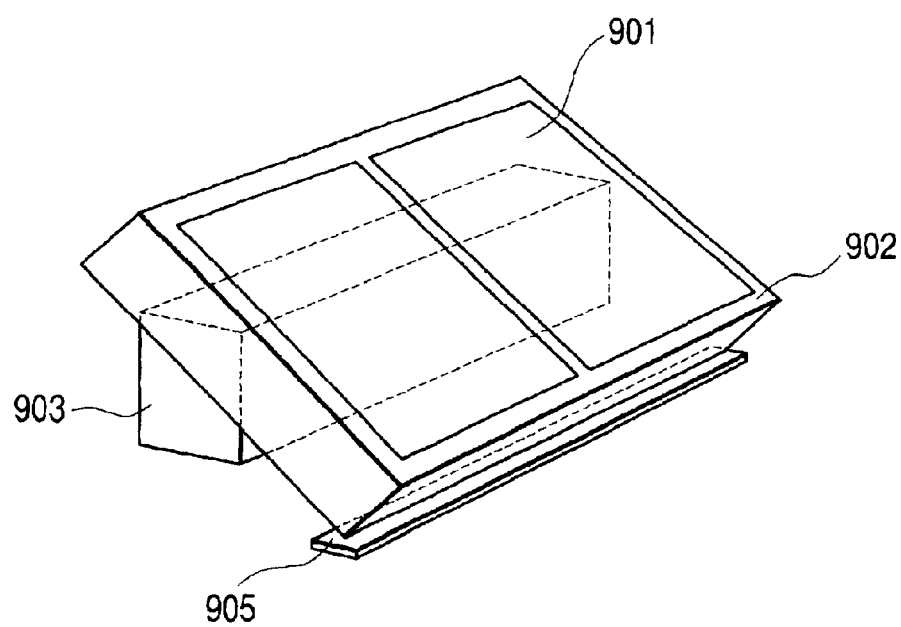

FIGS. 9A and 9B are schematic views for illustrating the insulating member used in this Example. In FIGS. 9A and 9B, reference numeral 901 denotes solar cells; 902, a support; 903, a back support; 904, the ground; and 905, the insulating member. As shown in FIGS. 9A and 9B, the insulating member was placed only at the part where the support 902 came into contact with the ground 904.

As the insulating member 905, a silicone resin sheet (Si rubber, 2 t product, available from ZATCOFF) was used. After the back support 903 was placed, the insulating member 905 was previously placed on the ground, and then the support 902 was so placed that the support 902 came into contact with the ground 904 via the insulating member 905. Also, the surface tension of the silicone resin sheet was measured to find that it was 25 mN/m.

Except the foregoing, solar-cell-installed structures were set up in the same manner as in Example 1 in respect of the manner of fixing the solar cells, the placement of solar-cell-installed structures and the manner of wiring between those connected in series.

Then, in the state the solar-cell-installed structures set up in this Example were completely wet with rain water, the electrical resistance between the solar cells and the ground was measured to find that it was $10^4$Ω per one solar-cell-installed structure. It was measured in the same manner as in Example 1. From this result, it can be said that the power loss has well been kept from being caused.

Thus, according to the solar-cell-installed structure of this Example, the following effects can be expected.

Since the back support is placed on the non-light-receiving side of the support, the support and the back support can be made small-sized and light-weight, promising an improved construction performance.

Since the structure is so set up that the support comes into contact with the ground via the insulating member, a high electrical resistance can be provided between the solar cells and the ground, any leakage current can be small, and the power loss can be lessened.

Since the insulating member has a surface tension of 28 mN/m or less, the surface of the insulating member can be well waterproof, and the leakage current may flow to the ground with difficulty. Hence, the power loss can be lessened.

EXAMPLE 4

A solar-cell-installed structure was set up in the same manner as in Example 1 except that insulating members were placed between the support and the ground and between the support and the back support.

FIGS. 3A and 3B are schematic views for illustrating the insulating members used in this Example (what reference numerals denote in the drawings have already been described).

As the insulating members 305 and 306, silicone resin sheets (Si rubber, 2 t product, available from ZATCOFF) were used. After the back support 303 was placed, one insulating member 305 was previously placed on the ground 304, and then the other insulating member 306 was kept bonded and fixed to the part where the back support 303 was to come into contact with the support 302. Next, the support 302 was so placed that the support 302 came into contact with the ground 304 via the insulating member 305 and also it came into contact with the back support 303 via the insulating member 306. Also, the surface tension of the silicone resin sheets was measured to find that it was 25 mN/m.

Except the foregoing, solar-cell-installed structures were set up in the same manner as in Example 1 in respect of the manner of fixing the solar cells, the placement of solar-cell-installed structures and the manner of wiring between those connected in series.

Then, in the state the solar-cell-installed structures set up in this Example were completely wet with rain water, the electrical resistance between the solar cells and the ground was measured to find that it was $10^7 \Omega$ per one solar-cell-installed structure. It was measured in the same manner as in Example 1. From this result, it can be said that the power loss has well been kept from being caused.

Thus, according to the solar-cell-installed structure of this Example, the following effects can be expected.

Since the back support is placed on the non-light-receiving side of the support, the support and the back support can be made small-sized and light-weight, promising an improved construction performance.

Since the structure is so set up that the support comes into contact with the ground and back support via the insulating members, a high electrical resistance can be provided between the solar cells and the ground, any leakage current can be small, and the power loss can be lessened.

Since the insulating member has a surface tension of 28 mN/m or less, the surface of the insulating member can be well waterproof, and the leakage current may flow to the ground with difficulty. Hence, the power loss can be lessened.

EXAMPLE 5

This is an example in which insulating members having a larger thickness were used in Example 4. A solar-cell-installed structure was set up in the same manner as in Example 4 except the above.

FIGS. 7A and 7B are schematic views for illustrating the insulating members used in this Example (what reference numerals denote in the drawings have already been described).

As the insulating members 705 and 706, silicone resin plates (rubber compound available from Shin-Etsu Chemical Co., Ltd.; high-strength molded product; thickness: 10 mm) were used. After the back support 703 was placed, one insulating member 705 was previously placed on the ground 704, and then the other insulating member 706 was kept bonded and fixed to the back side of the support 702. Next, the support 702 was so placed that the support 702 came into contact with the ground 704 via the insulating member 705 and also it came into contact with the back support 703 via the insulating member 706. Also, the surface tension of the silicone resin plates was measured to find that it was 26 mN/m.

Except the foregoing, solar-cell-installed structures were set up in the same manner as in Example 4 in respect of the manner of fixing the solar cells, the placement of solar-cell-installed structures and the manner of wiring between those connected in series.

Then, in the state the solar-cell-installed structures set up in this Example were completely wet with rain water, the electrical resistance between the solar cells and the ground was measured to find that it was $10^7 \Omega$ per one solar-cell-installed structure. It was measured in the same manner as in Example 1. From this result, it can be said that the power loss has well been kept from being caused.

Thus, according to the solar-cell-installed structure of this Example 5, the following effects can be expected.

Since the structure is so made up that the back support is placed on the non-light-receiving side of the support, the support and the back support can be made small-sized and light-weight, promising an improved construction performance.

Since the structure is so set up that the support comes into contact with the ground and back support via the insulating members, a high electrical resistance can be provided between the solar cells and the ground, any leakage current can be small, and the power loss can be lessened.

Since the insulating member has a surface tension of 28 mN/m or less, the surface of the insulating member can be well waterproof, and the leakage current may flow to the ground with difficulty. Hence, the power loss can be lessened.

EXAMPLE 6

This is an example in which the photovoltaic power generation system shown in FIGS. 12A and 12B (what reference numerals denote in the drawings have already been described) was constructed using the solar-cell-installed structure of Example 4 in which the insulating members were placed between the support and the ground and between the support and the back support. In the same manner as in Example 1, the solar cells on the support were electrically interconnected through the wiring materials 1202 and forty solar-cell-installed structures were connected in series. The total voltage of the system was set to be 56 V.

In the state the solar-cell-installed structures set up in this Example were completely wet with rain water, the electrical resistance between the solar cells and the ground was measured to find that it was $10^7 \Omega$ per one solar-cell-installed structure. Since the conditions under which the power loss can be controlled within 1% is represented by Expression (10), i.e., R>50V/l, this electrical resistance comes to be R>304Ω where l=4.6 A×2 and V=56 V are substituted for that expression. Hence, as long as it is 304Ω or more, the power loss can be controlled within 1%. Since in this Example it is $10^7 \Omega$, it can be said that the power loss has well been kept from being caused.

From Expression (12), which represents conditions under which the ground fault detection does not act unintentionally, i.e., R>5×V×N, the electrical resistance R between the solar cells and the ground at which resistance the ground fault detection does not act unintentionally is 5×56×40=11,200Ω. Since the electrical resistance between the solar cells and the ground is 107Ω, this is not a level at which any ground fault detection may act. It can be said that the system is highly reliable and electrically safe.

In the manner described above, the line-connected system making use of the solar-cell-installed structures of the present invention can be set up. Also, where the insulating members are placed in the solar-cell-installed structure as in this Example, not only the power loss can be kept from being caused, but also, when connected with the inverter, the leakage current can be small and hence the inverter can be kept from stopping to operate because of the unintentional ground fault detection.

As having been described above, the present invention can bring about the following effects.

Since the support is in only line or spot contact with the ground, a high electrical resistance can be provided between the solar cells and the ground, any leakage current can be small, and the power loss can be lessened.

Since the support may be made of a concrete material, the support may only be placed on the ground to finish its placement. Also, the concrete has a high outdoor durability and is inexpensive.

Since the back support may be placed on the non-light-receiving side of the support, the support and the back support can be made small-sized and light-weight, promising an improved construction performance.

Since the structure may be so set up that the support is also in only line or spot contact with the back support, a high electrical resistance can be provided between the solar cells and the ground, any leakage current from can be small, and the power loss can be lessened.

Since the support may be platelike, the structure can be formed using the support and the back support separately, and hence the support may be placed after the back support has been placed. Thus, the angle of installation can arbitrarily be changed.

In the case when the support is platelike, the support is so made as to satisfy the relation of:

$$t > 1,307.9(0.71+0.016 \cdot \theta)/(d \cdot g \cdot \cos \theta),$$

where d is the density (kg/m³) of the support, g is the acceleration of gravity (m/s²) of the support, θ is the angle of inclination of the support from the ground, and t is the thickness (m) of the support. This can make the support not move even in a strong wind of as high as 60 m/s in wind velocity, and hence a solar-cell-installed structure having a higher reliability can be provided.

Since the support may come into contact with the ground via the insulating member, the electrical resistance between the solar cells and the ground can be made much greater, any leakage current can be smaller, and the power loss can more be lessened.

Since the insulating member may be provided between the support and the back support, the electrical resistance between the solar cells and the ground can be made more greater, any leakage current can be smaller, and the power loss can be lessened.

Since the insulating member may have a surface tension of 28 mN/m or less, the surface of the insulating member can be well waterproof, and the leakage current may flow to the ground with difficulty. Hence, the power loss can be lessened.

In the case when the solar-cell-installed structures are electrically connected in plurality and are connected with the inverter, the leakage current can be small and hence the inverter can be prevented from stopping to operate because of the unintentional ground fault detection.

In the case when the solar-cell-installed structures are connected in series and satisfy the relation of R>5×V×N, where N is the number of solar-cell-installed structures connected in series, V is the voltage (V) of the photovoltaic power generation system and R is the electrical resistance (Ω) between the solar cells and the ground, the ground fault detection in the case of common inverters (which stop at 100 mA or more) does not act, and hence the inverter can be prevented from stopping to operate.

What is claimed is:

1. A solar-cell-installed structure comprising:
    a solar cell at least part of active electric portions of which stands exposed to surroundings; and
    a support placed on the ground and on which support the solar cell is fixed,
    wherein the support is in only spot or line contact with the ground.

2. The solar-cell-installed structure according to claim 1, wherein the support comprises a concrete material.

3. The solar-cell-installed structure according to claim 1, which further comprises a back support which supports the support placed on the ground, provided on the non-light-receiving side of the support placed on the ground.

4. The solar-cell-installed structure according to claim 3, wherein the support placed on the ground is in only spot or line contact with the back support.

5. The solar-cell-installed structure according to claim 3, wherein the support placed on the ground is in the form of a plate.

6. The solar-cell-installed structure according to claim 5, which satisfies the relation of:

$$t > 1,307.9(0.71+0.016 \cdot \theta)/(d \cdot g \cdot \cos \theta),$$

where d is the density (kg/m³) of the support placed on the ground, g is the acceleration of gravity (m/s²) of the support placed on the ground, θ is the angle of inclination of the support placed on the ground from the ground, and t is the thickness (m) of the support placed on the ground.

7. A solar-cell-installed structure comprising:
    a solar cell at least part of active electric portions of which stands exposed to surroundings; and
    a support placed on the ground in such a way that the support forms an inclined plane, with the solar cell being fixed on the inclined plane,
    wherein the support is in contact with the ground at least via an insulating member.

8. The solar-cell-installed structure according to claim 7, wherein the support comprises a concrete material.

9. A solar-cell-installed structure comprising:
    a solar cell at least part of active electric portions of which stands exposed to surroundings;
    a support placed on the ground and on which support the solar cell is fixed; and
    a back support which supports the support placed on the ground, provided on the non-light-receiving side of the support placed on the ground,
    wherein the support placed on the ground is in contact with the ground at least via an insulating member.

10. The solar-cell-installed structure according to claim 9, which has an insulating member between the support placed on the ground and the back support.

11. The solar-cell-installed structure according to claim 9, wherein the support placed on the ground is in the form of a plate.

12. The solar-cell-installed structure according to claim 11, which satisfies the relation of:

$$t > 1,307.9(0.71+0.016 \cdot \theta)/(d \cdot g \cdot \cos \theta),$$

where d is the density (kg/m³) of the support placed on the ground, g is the acceleration of gravity (m/s²) of the support placed on the ground, θ is the angle of inclination of the support placed on the ground from the ground, and t is the thickness (m) of the support placed on the ground.

13. The solar-cell-installed structure according to claim 7, wherein the insulating member has a surface tension of 28 mN/m or less.

14. A photovoltaic power generation system comprising:
   at least two solar-cell-installed structures which are electrically interconnected; and
   an inverter connected to the positive and negative terminals of the at least two solar-cell-installed structures and having a ground fault sensor;
   the solar-cell-installed structures each comprising:
   (i) a solar cell at least part of active electric portions of which stands exposed to surroundings; and
   (ii) a support placed on the ground and on which support the solar cell is fixed,
   wherein the support is in only spot or line contact with the ground.

15. The photovoltaic power generation system according to claim 14, wherein the solar-cell-installed structures are connected in series, and satisfy the relation of R>5×V×N, where N is the number of the solar-cell-installed structures connected in series, V is the voltage (V) of the photovoltaic power generation system, and R is the electrical resistance (Ω) between solar cells and the ground.

16. A photovoltaic power generation system comprising:
   at least two solar-cell-installed structures which are electrically interconnected; and
   an inverter connected to the positive and negative terminals of the at least two solar-cell-installed structures and having a ground fault sensor;
   the solar-cell-installed structures each comprising:
   (i) a solar cell at least part of active electric portions of which stands exposed to surroundings; and
   (ii) a support placed on the ground in such a way that the support forms an inclined plane, with the solar cell being fixed on the inclined plane,
   wherein the support is in contact with the ground at least via an insulating member.

17. The photovoltaic power generation system according to claim 16, wherein the solar-cell-installed structures are connected in series, and satisfy the relation of R>5×V×N, where N is the number of the solar-cell-installed structures connected in series, V is the voltage (V) of the photovoltaic power generation system, and R is the electrical resistance (Ω) between solar cells and the ground.

18. A photovoltaic power generation system comprising:
   at least two solar-cell-installed structures which are electrically interconnected; and
   an inverter connected to the positive and negative terminals of the at least two solar-cell-installed structures and having a ground fault sensor;
   the solar-cell-installed structures each comprising:
   (i) a solar cell at least part of active electric portions of which stands exposed to surroundings;
   (ii) a support placed on the ground and on which support the solar cell is fixed; and
   (iii) a back support which supports the support placed on the ground, provided on the non-light-receiving side of the support placed on the ground,
   wherein the support placed on the ground is in contact with the ground at least via an insulating member.

19. A solar-cell-installed structure comprising:
   a solar cell at least part of active electric portions of which stands exposed to surroundings; and
   a support placed on the ground in such a way that the support forms an inclined plane, with the solar cell being fixed on the inclined plane,
   wherein the support is in contact with the ground at least via an insulating member, and
   wherein the support has an L-shaped section.

20. A photovoltaic power generation system comprising:
   at least two solar-cell-installed structures which are electrically interconnected; and
   an inverter connected to the positive and negative terminals of the at least two solar-cell-installed structures and having a ground fault sensor;
   the solar-cell-installed structures each comprising:
   (i) a solar cell at least part of active electric portions of which stands exposed to surroundings; and
   (ii) a support placed on the ground in such a way that the support forms an inclined plane, with the solar cell being fixed on the inclined plane,
   wherein the support is in contact with the ground at least via an insulating member, and
   wherein the support has an L-shaped section.

* * * * *

UNITED STATES PATENT AND TRADEMARK OFFICE
CERTIFICATE OF CORRECTION

PATENT NO. : 6,803,515 B2
DATED : October 12, 2004
INVENTOR(S) : Shigenori Itoyama et al.

It is certified that error appears in the above-identified patent and that said Letters Patent is hereby corrected as shown below:

Title page,
Item [56], References Cited, U.S. PATENT DOCUMENTS, insert the following:
-- 6,703,555 B2      03/2004    Takabayahsi et al.   136/251
   2004/0000334 A1   01/2004    Ressler              136/251
   2004/0007260 A1   01/2004    Dinwoodie            136/251
   2004/0045595 A1   03/2004    Makita et al.        136/244 --.

Column 17,
Line 7, "107Ω," should read -- $10^7 \Omega$, --.

Signed and Sealed this

Twenty-seventh Day of September, 2005

JON W. DUDAS
*Director of the United States Patent and Trademark Office*